US008219368B1

(12) United States Patent  (10) Patent No.: US 8,219,368 B1
Akella et al.  (45) Date of Patent: Jul. 10, 2012

(54) CAPACITY MODELING SYSTEM

(75) Inventors: Vijay B. Akella, Charlotte, NC (US); Nicholas G. Hesse, Loudon, TN (US); Matthew S. Kukielski, Charlotte, NC (US); Cheryl E. Robinson, Doraville, GA (US); Bryant Lee Osborn, Culpeper, VA (US); Thomas A. Wheeler, Richmond, VA (US); James E. Dunevant, Mascoutah, IL (US); Christian P. Selmi, San Carlos, CA (US)

(73) Assignee: Bank of America Corporation, Charlotte, NC (US)

( * ) Notice: Subject to any disclaimer, the term of this patent is extended or adjusted under 35 U.S.C. 154(b) by 566 days.

(21) Appl. No.: 12/467,701

(22) Filed: May 18, 2009

(51) Int. Cl.
 *G06G 7/48* (2006.01)
(52) U.S. Cl. .......................................................... 703/6
(58) Field of Classification Search .................. 706/6
 See application file for complete search history.

(56) References Cited

U.S. PATENT DOCUMENTS

| | | | | |
|---|---|---|---|---|
| 7,584,164 | B2 * | 9/2009 | McCaffrey | 706/52 |
| 2006/0218074 | A1 * | 9/2006 | Kohn | 705/37 |
| 2008/0228459 | A1 * | 9/2008 | Jiang et al. | 703/13 |
| 2008/0262822 | A1 * | 10/2008 | Hardwick et al. | 703/21 |
| 2010/0205039 | A1 * | 8/2010 | Basak et al. | 705/10 |

OTHER PUBLICATIONS

Franke et al "Bridging the Gap: Linking It-Infrastructure and Business Processes", Institute for Information Systems Johann Wolfgang Goethe University, Apr. 27, 2004.*

* cited by examiner

*Primary Examiner* — David Silver
(74) *Attorney, Agent, or Firm* — Michael A. Springs; Moore & Van Allen, PLLC; Jeffrey R. Gray

(57) ABSTRACT

Embodiments of the present invention provide apparatuses and methods for a capacity model run-time estimator that determines the transactional capacity of an application. The capacity model run-time estimator is based on a model that includes at least one job with various steps within a run-time window. One or more windows make up shifts and one or more shifts make up a day. Historical data is used to estimate various run-times for each of the steps in a window. If the steps are dependent on transaction characteristics a statistical analysis is used to determine a run-time window estimator model that is dependent on the transaction characteristics. Constraints are placed on the run-time and transaction capacity of the windows, intra-windows, and shifts. The capacity model uses the run-time window estimators and constraints to determine the transaction capacity for an application across various periods and compares the results to forecasted capacity.

23 Claims, 8 Drawing Sheets

FIG. 4

| Windows Run Time Models | | | |
|---|---|---|---|
| Region | Variable | Value | Comments |
| VA | VA Constant | 533.271930 | in seconds |
| VA | VA Collection Multipler | 0.001053 | |
| VA | VA Distribution Multiplier | 0.000180 | |

FIG. 5a

Other Variables

| S.No. | Description | Value |
|---|---|---|
| 1 | Maximun run time of Shift 1 (secs) | 18000 |
| 2 | Maximum run time of Shift 2 (secs) | 36000 |
| 3 | Maximum run time of Shift 3 (secs) | 18000 |
| 4 | Maximum run time of Window 1 (secs) | 1740 |
| 5 | Maximum run time of Window 2 (secs) | 3984 |
| 6 | Maximum run time of Window 3 (secs) | 1980 |
| 7 | Maximum run time of Window 4 (secs) | 2364 |
| 8 | Maximum run time of Window 5 (secs) | 2058 |
| 9 | Maximum run time of Window 6 (secs) | 1740 |
| 10 | Maximum run time of Window 7 (secs) | 1914 |
| 11 | Maximum run time of Window 8 (secs) | 1794 |
| 12 | Maximum run time of Window 9 (secs) | 1914 |
| 13 | Maximum run time of Window 10 (secs) | 2034 |
| 14 | Maximum run time of Window 11 (secs) | 1740 |
| 15 | Inter-window run time after Window 1 (secs) | 1200 |
| 16 | Inter-window run time after Window 2 (secs) | 1200 |
| 17 | Inter-window run time after Window 3 (secs) | 1200 |
| 18 | Inter-window run time after Window 4 (secs) | 2700 |
| 19 | Inter-window run time after Window 5 (secs) | 3600 |
| 20 | Inter-window run time after Window 6 (secs) | 5400 |
| 21 | Inter-window run time after Window 7 (secs) | 5400 |
| 22 | Inter-window run time after Window 8 (secs) | 5400 |
| 23 | Inter-window run time after Window 9 (secs) | 5400 |
| 24 | Inter-window run time after Window 10 (secs) | 2700 |
| 25 | Inter-window run time after Window 11 (secs) | 1800 |
| 26 | Ratio of Collections to Distributions for window 1 | 0.00 |
| 27 | Ratio of Collections to Distributions for window 2 | 0.48 |
| 28 | Ratio of Collections to Distributions for window 3 | 1.29 |
| 29 | Ratio of Collections to Distributions for window 4 | 5.73 |
| 30 | Ratio of Collections to Distributions for window 5 | 1.46 |
| 31 | Ratio of Collections to Distributions for window 6 | 2.78 |
| 32 | Ratio of Collections to Distributions for window 7 | 2.00 |
| 33 | Ratio of Collections to Distributions for window 8 | 7.54 |
| 34 | Ratio of Collections to Distributions for window 9 | 1.28 |
| 35 | Ratio of Collections to Distributions for window 10 | 4.09 |
| 36 | Ratio of Collections to Distributions for window 11 | 0.61 |

FIG. 5b

Constraints 550

| Shift | Description | Formula 556 | Relation 558 | Value 554 |
|---|---|---|---|---|
| 1 | Total run time of shift 1 | 16368.00 | <= | 18000 |
| 1 | Maximum run time of window 1 | 1740.00 | <= | 1740 |
| 1 | Maximum run time of window 2 | 3984.00 | <= | 3984 |
| 1 | Maximum run time of window 3 | 1980.00 | <= | 1980 |
| 1 | Maximum run time of window 4 | 2364.00 | <= | 2364 |
| 1 | Ratio of Collections to Distributions for window 1 | 0.00 | = | 0.00 |
| 1 | Ratio of Collections to Distributions for window 2 | 0.00 | = | 0.48 |
| 1 | Ratio of Collections to Distributions for window 3 | 0.00 | = | 1.29 |
| 1 | Ratio of Collections to Distributions for window 4 | 0.00 | = | 5.73 |
| 2 | Total run time of shift 2 | 27306.00 | <= | 36000 |
| 2 | Maximum run time of window 5 | 2058.00 | <= | 2058 |
| 2 | Maximum run time of window 6 | 1740.00 | <= | 1740 |
| 2 | Maximum run time of window 7 | 1914.00 | <= | 1914 |
| 2 | Maximum run time of window 8 | 1794.00 | <= | 1794 |
| 2 | Ratio of Collections to Distributions for window 5 | 0.00 | = | 1.46 |
| 2 | Ratio of Collections to Distributions for window 6 | 0.00 | = | 2.78 |
| 2 | Ratio of Collections to Distributions for window 7 | 0.00 | = | 2.00 |
| 2 | Ratio of Collections to Distributions for window 8 | 0.00 | = | 2.00 |
| 1 | Total run time of shift 3 | 15568.00 | <= | 18000 |
| 1 | Maximum run time of window 9 | 1914.00 | <= | 1914 |
| 1 | Maximum run time of window 10 | 2034.00 | <= | 2034 |
| 1 | Maximum run time of window 11 | 1740.00 | <= | 1740 |
| 1 | Ratio of Collections to Distributions for window 9 | 0.00 | = | 1.28 |
| 1 | Ratio of Collections to Distributions for window 10 | 0.00 | = | 4.09 |
| 1 | Ratio of Collections to Distributions for window 11 | 0.00 | = | 0.61 |

ACH Transactional Capacity Solver — 602, 600, 604

| Outputs | | |
|---|---:|---|
| 610 — Shift 1 Transactional Capacity | 18,291,277 | Calculate |
| 612 — Shift 2 Transactional Capacity | 7,118,474 | Calculate |
| 614 — Shift 3 Transactional Capacity | 6,125,554 | Calculate |
| Total Transactional Capacity (per day) | 31,535,306 | |

650

| S.No. | Description | Output |
|---|---|---:|
| 1 | Number of collections in Window 1 | 0 |
| 2 | Number of Distributions in Window 1 | 6,704,045 |
| 3 | Number of collections in Window 2 | 2,416,476 |
| 4 | Number of Distributions in Window 2 | 5,034,325 |
| 5 | Number of collections in Window 3 | 1,213,154 |
| 6 | Number of Distributions in Window 3 | 940,429 |
| 7 | Number of collections in Window 4 | 1,688,219 |
| 8 | Number of Distributions in Window 4 | 294,628 |
| 9 | Number of collections in Window 5 | 1,296,220 |
| 10 | Number of Distributions in Window 5 | 887,822 |
| 11 | Number of collections in Window 6 | 1,079,606 |
| 12 | Number of Distributions in Window 6 | 388,348 |
| 13 | Number of collections in Window 7 | 1,207,986 |
| 14 | Number of Distributions in Window 7 | 603,993 |
| 15 | Number of collections in Window 8 | 1,102,999 |
| 16 | Number of Distributions in Window 8 | 551,500 |
| 17 | Number of collections in Window 9 | 1,156,752 |
| 18 | Number of Distributions in Window 9 | 903,712 |
| 19 | Number of collections in Window 10 | 1,368,017 |
| 20 | Number of Distributions in Window 10 | 334,478 |
| 21 | Number of collections in Window 11 | 895,144 |
| 22 | Number of Distributions in Window 11 | 1,467,450 |

FIG. 7

|   |   | Capacity | | | Actual Peaks as of November | | |
|---|---|---|---|---|---|---|---|
|   |   | Collection | Distribution | Total | Collection | Distribution | Total |
| NE | Morning Shift (0100 - 0600) | 1,961,365 | 9,205,881 | 11,167,246 | 2,370,689 | 2,854,472 | 5,225,161 |
|    | Day Shift (0900 - 1700) | 7,162,030 | 3,955,474 | 11,117,504 | 4,332,670 | 3,033,744 | 7,366,414 |
|    | Swing Shift (1900-2230) | 2,700,664 | 2,104,967 | 4,805,631 | 1,094,779 | 481,197 | 1,575,976 |
|    | Total Daily Capacity | 11,824,060 | 15,266,322 | 27,090,382 | 7,798,138 | 6,369,413 | 14,167,551 |
| CA | Morning Shift (0100 - 0600) | 3,747,051 | 17,876,019 | 21,623,070 | 4,231,957 | 4,398,329 | 8,630,286 |
|    | Day Shift (0900 - 1700) | 9,555,587 | 5,283,342 | 14,838,929 | 2,137,659 | 1,139,138 | 3,276,797 |
|    | Swing Shift (1900-2230) | 8,379,495 | 4,054,173 | 12,433,668 | 1,974,267 | 1,062,516 | 3,036,783 |
|    | Total Daily Capacity | 21,682,132 | 27,213,534 | 48,895,667 | 8,343,883 | 6,599,983 | 14,943,866 |
| VA | Morning Shift (0100 - 0600) | 8,205,237 | 38,396,362 | 46,601,600 | 2,403,828 | 3,714,665 | 6,118,493 |
|    | Day Shift (0900 - 1700) | 13,854,315 | 5,051,511 | 18,905,826 | 927,363 | 395,966 | 1,323,329 |
|    | Swing Shift (1900-2230) | 7,567,028 | 6,144,236 | 13,711,263 | 1,923,549 | 652,694 | 2,576,243 |
|    | Total Daily Capacity | 29,626,580 | 49,592,108 | 79,218,688 | 5,254,740 | 4,763,325 | 10,018,065 |
| TX | Morning Shift (0100 - 0600) | 7,453,414 | 38,920,620 | 46,374,034 | 2,938,266 | 5,078,953 | 8,017,239 |
|    | Day Shift (0900 - 1700) | 14,590,019 | 5,714,893 | 20,304,911 | 1,607,520 | 729,062 | 2,336,582 |
|    | Swing Shift (1900-2230) | 7,992,488 | 6,480,987 | 14,473,475 | 902,786 | 238,324 | 1,141,110 |
|    | Total Daily Capacity | 30,035,921 | 51,116,500 | 81,152,421 | 5,448,592 | 6,046,339 | 11,494,931 |

CAPACITY MODELING SYSTEM

FIELD

This invention relates generally to the field of application capacity modeling, and more particularly embodiments of the invention relate to apparatuses and methods, for providing a unique formal approach to determining the transactional capacity of an application.

BACKGROUND

Transaction capacity of an application is defined as the maximum number of transactions that can be processed by an application in a period while meeting application service level agreements ("SLAs") and also process requirements of operation teams.

As it stands, there is no formal methodology to determine the transactional capacity of applications. There are some products that provide run-time performance data, but a formalized capacity analysis procedure has not been created. Generally, capacity determinations rely on past history of performance and experience but do not provide a clear indicator on how long the application will have the necessary capacity to support the business.

Currently, capacity analysis is based on experience and gut feel and is single dimensioned as it considers transaction volumes only. These practices have been inaccurate and do not provide sufficient insight and transparency to make investment decisions for capacity upgrades. This leads to the inability of a business application to meet its capacity requirements resulting in both financial and reputational impact to the business.

There is a need to develop apparatuses and methods to incorporate application specific intelligence and consider the operational processes to provide a better measure of the transactional capacity of applications.

BRIEF SUMMARY

Embodiments of the present invention address the above needs and/or achieve other advantages by providing apparatuses (e.g., a system, computer program product, and/or other device), methods, or a combination of the foregoing for a capacity model run-time estimator that determines the transactional capacity of an application. The transactional capacity is the upper limit in transactional volume by an application at a time of day, which can be processed without impact to the SLAs.

The capacity model run-time estimator provides the ability to determine the maximum capacity based on provided parameters through an optimization solver. The capacity model run-time estimator is based on a model that includes at least one job with various steps within a run-time window. One or more windows make up shifts and one or more shifts make up a day. Historical data is captured over a period of time for each step within a window. The historical data is used to estimate various run-times for each of the steps in a window. If the steps are dependent on transaction characteristics the historical data is used in a regression analysis or other statistical analysis to determine a run-time window estimator model that is dependent on the transaction characteristics. Constraints are placed on the run-time and transaction capacity of the windows, intra-windows (time between window runs), and shifts. The capacity model uses the run-time window estimators for each window, and the constraints for the windows, intra-windows, and shifts to determine the transaction capacity for an application across various times of the day, week, month, etc.

The transactional capacity is analyzed against volume forecasts and peak transactions for an application over a period of time. The analysis helps the organization, in the long and short term, plan for changes to SLAs, the number of systems on which the application is run, the environments supporting the transactions, the application itself, the transaction characteristics, etc.

One embodiment of the invention is a capacity modeling system for creating a capacity model comprising a memory device, a communication device, and a processing device. The processing device is operatively coupled to the memory device and the communication device, and is configured to execute computer-readable program code to capture transactional data for an application. The processing device is further configured to execute computer-readable program code to run a window run-time estimator model based on the transactional data. The processing device is also configured to execute computer-readable program code to apply constraints to the capacity model. The processing device is further configured to execute computer-readable program code to run a shift run-time estimator model based on the window run-time estimator model and the constraints. The processing device is also configured to execute computer-readable program code to calculate a transaction capacity of the application.

In further accord with an embodiment of the invention, the processing device is further configured to execute computer-readable program code to run or receive volume forecasts for the application and compare the volume forecasts with the transaction capacity of an application to determine if the transaction capacity needs to be addressed.

In another embodiment of the invention, the window run-time estimator model is based on a statistical analysis of historical transactional data.

In yet another embodiment of the invention, the window run-time estimator model is based on a regression analysis of historical transactional data.

In another embodiment of the invention, the constraints applied to the capacity model system are constraints on the window, inter-window, or shift run-times.

In yet another embodiment of the invention, the transaction capacity of an application is calculated through the use of an optimization solver.

One embodiment of the invention is a computer program product for a capacity modeling system for creating a capacity model. The computer program product comprises at least one computer-readable medium having computer-readable program code portions embodied therein. The computer-readable program code portions comprise executable portions. One executable portion is configured for capturing transactional data for an application using a processing device operatively coupled to a communication device and a memory device. Another executable portion is configured for developing a window run-time estimator model based on the transactional data, using the processing device. Another executable portion is configured for applying constraints to the capacity model, using the processing device. Another executable portion is configured for developing a shift run-time estimator model based on the window run-time estimator model and the constraints, using the processing device. Another executable portion is configured for calculating a transaction capacity of the application.

In further accord with an embodiment of the invention, the computer program product comprises an executable portion configured for developing or receiving volume forecasts for the application, using the processing device, and comparing the volume forecasts with the transaction capacity of the application to determine if the transaction capacity needs to be addressed.

In another embodiment of the invention, the executable portion configured for developing the window run-time estimator model is configured to develop the window run-time estimator based on a statistical analysis of historical transactional data.

In yet another embodiment of the invention, the executable portion configured for developing the window run-time estimator model is configured to develop the window run-time estimator based on a regression analysis of historical transactional data.

In another embodiment of the invention, the executable portion configured for applying the constraints to the capacity model system is configured for applying the constraints to the window, inter-window, or shift run-times.

In yet another embodiment of the invention, the executable portion configured for calculating transaction capacities of an application is configured to calculate the transaction capacities of an application through the use of an optimization solver.

One embodiment of the invention is a capacity modeling method for developing a capacity model. The method comprises capturing transactional data for an application using a processing device operatively coupled to a memory device and a communication device, and configured to execute computer-readable program code. The method further comprises developing a window run-time estimator model based on the transactional data, using the processing device. The method also comprises applying constraints to the capacity model, using the processing device. The method further comprises developing a shift run-time estimator model based on the window run-time estimator model and the constraints, using the processing device. The method also comprises calculating a transaction capacity of the application.

In further accord with an embodiment of the invention, the capacity modeling method comprises developing or receiving volume forecasts for the application, using the processing device, and comparing the volume forecasts with the transaction capacity of the application to determine if the transaction capacity needs to be addressed.

In another embodiment of the invention, the capacity modeling method further comprises developing corrective actions for the capacity of the application when the transaction capacity needs to be addressed.

In yet another embodiment of the invention, the capacity modeling method further comprises calculating the transaction capacity of the application on a periodic basis or after events occur which affect the transaction capacity of the application.

In another embodiment of the invention, developing a window run-time estimator model based on the transactional data comprises using a statistical analysis of historical transactional data.

In yet another embodiment of the invention, developing a window run-time estimator model based on the transactional data comprises using a regression analysis of historical transactional data.

In further accord with an embodiment of the invention, applying constraints to the capacity model comprises applying constraints to the window, inter-window, or shift run-times.

In another embodiment of the invention, calculating transaction capacities of an application comprises using an optimization solver.

The features, functions, and advantages that have been discussed may be achieved independently in various embodiments of the present invention or may be combined in yet other embodiments, further details of which can be seen with reference to the following description and drawings.

BRIEF DESCRIPTION OF THE SEVERAL VIEWS OF THE DRAWINGS

Figure 1:
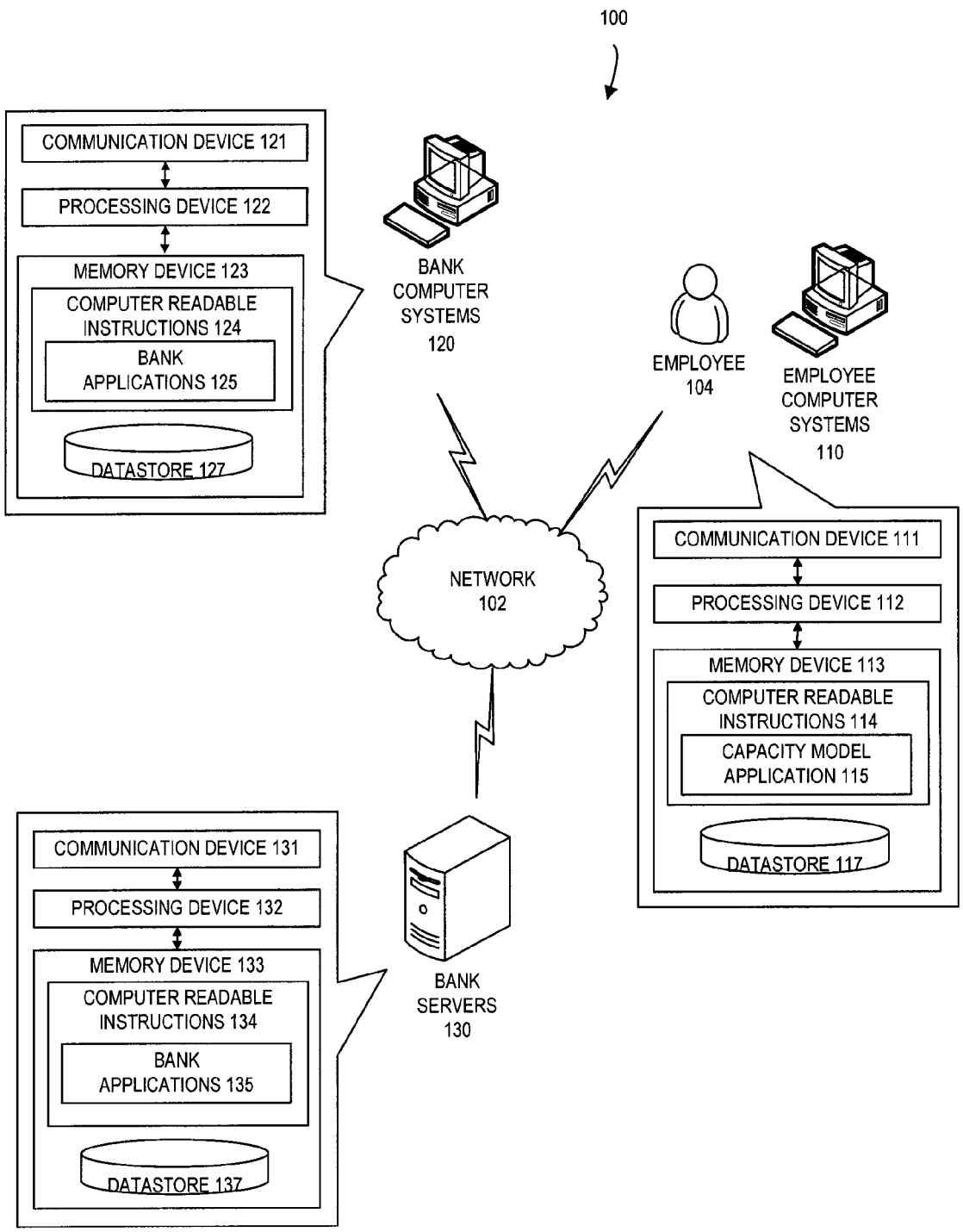
Figure 2:
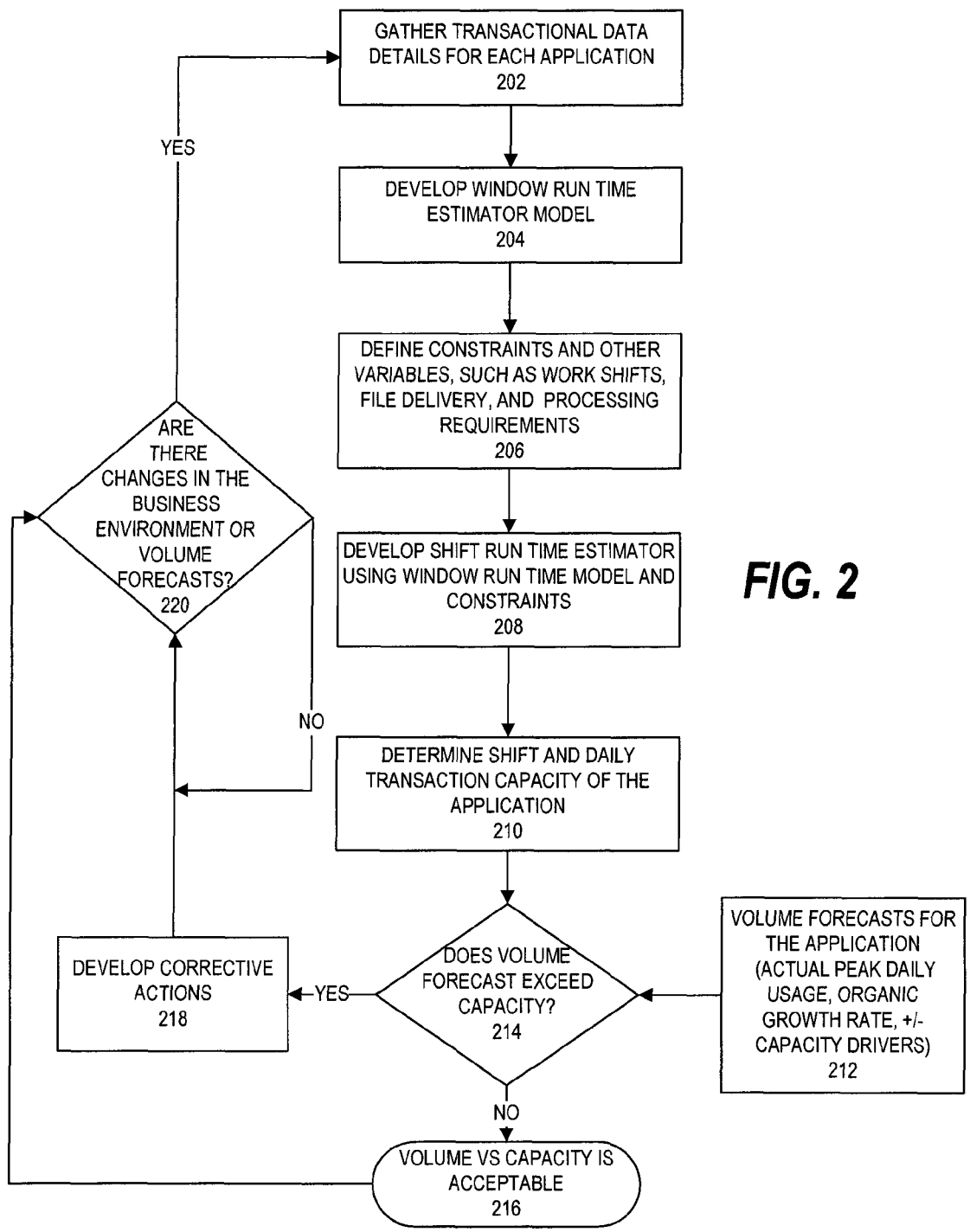
Figure 3:
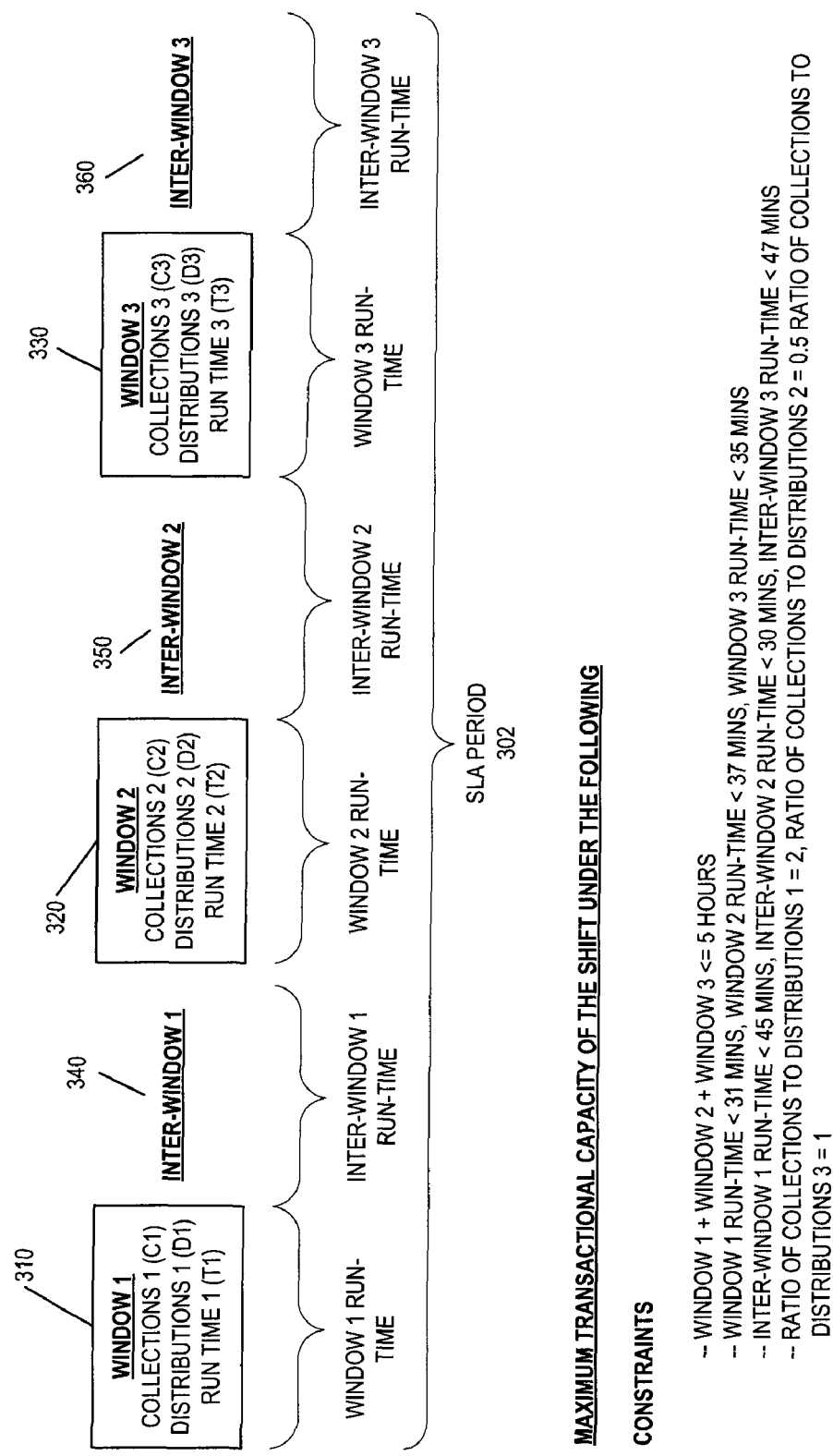

Having thus described embodiments of the invention in general terms, reference will now be made to the accompanying drawings, which are not necessarily drawn to scale, and wherein:

FIG. 1 provides a block diagram illustrating a capacity modeling system, in accordance with an embodiment of the invention;

FIG. 2 provides a process flow illustrating how the capacity model is created and analyzed, in accordance with one embodiment of the invention;

FIG. 3 provides part of a capacity model and associated constraints in diagram form, in accordance with one embodiment of the invention;

FIG. 4 provides an interface with a window run-time estimator model for a specific application, in accordance with one embodiment of the invention; and FIG. 5a provides an interface to input some of the constraints related to a specific application for the capacity model, in accordance with an embodiment of the invention;

FIG. 5b provides an interface to input additional constraints and optimization formulas related to a specific application for the capacity model, in accordance with an embodiment of the invention;

FIG. 6 provides an interface with the output of the optimization solver illustrating the optimal capacity for an application, in accordance with an embodiment of the invention; and FIG. 7 provides and interface comparing, for an application, the optimized transaction capacity verses the actual peak capacity for during a particular month, in accordance with and embodiment of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout. Although some embodiments of the invention described herein are generally described as involving a "bank," one of ordinary skill in the art will appreciate, in view of this disclosure, that other embodiments of the invention may involve other businesses or financial institutions that take the place of or work in conjunction with the bank to perform one or more of the processes or steps described herein as being performed by a bank.

As will be appreciated by one of skill in the art in view of this disclosure, the present invention may be embodied as an apparatus (e.g., a system, computer program product, and/or other device), a method, or a combination of the foregoing. Accordingly, embodiments of the present invention may take the form of an entirely hardware embodiment, an entirely software embodiment (including firmware, resident software, micro-code, etc.), or an embodiment combining software and hardware aspects that may generally be referred to herein as a "system." Furthermore, embodiments of the present invention may take the form of a computer program product comprising a computer-usable storage medium having computer-usable program code/computer-readable instructions embodied in the medium.

Any suitable computer-usable or computer-readable medium may be utilized. The computer usable or computer readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires; a tangible medium such as a portable computer diskette, a hard disk, a random access memory (RAM), a read-only memory (ROM), an erasable programmable read-only memory (EPROM or Flash memory), a compact disc read-only memory (CD-ROM), or other tangible optical or magnetic storage device.

Computer program code/computer-readable instructions for carrying out operations of embodiments of the present invention may be written in an object oriented, scripted or unscripted programming language such as Java, Perl, Smalltalk, C++ or the like. However, the computer program code/computer-readable instructions for carrying out operations of the invention may also be written in conventional procedural programming languages, such as the "C" programming language or similar programming languages.

Embodiments of the present invention are described below with reference to flowchart illustrations and/or block diagrams of methods or apparatuses (the term "apparatus" including systems and computer program products). It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a particular machine, such that the instructions, which execute via the processor of the computer or other programmable data processing apparatus, create mechanisms for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer readable memory produce an article of manufacture including instructions, which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions, which execute on the computer or other programmable apparatus, provide steps for implementing the functions/acts specified in the flowchart and/or block diagram block or blocks. Alternatively, computer program implemented steps or acts may be combined with operator or human implemented steps or acts in order to carry out an embodiment of the invention.

FIG. 1 illustrates a capacity modeling system 100 in accordance with an embodiment of the present invention. As illustrated in FIG. 1, the employee computer systems 110 are operatively coupled, via a network 102, to the bank computer systems 120, and bank servers 130. In this way, the employee 104 can receive and send electronic transaction data, including images and other related data, to and from these systems. The network 102 may be a global area network (GAN), such as the Internet, a wide area network (WAN), a local area network (LAN), or any other type of network or combination of networks. The network 102 may provide for wireline, wireless, or a combination of wireline and wireless communication between devices in the network 102.

As illustrated in FIG. 1, the employee computer systems 110 generally include a communication device 111, a processing device 112, and a memory device 113. As used herein, the term "processing device" generally includes circuitry used for implementing the communication and/or logic functions of a particular system. For example, a processing device may include a digital signal processor device, a microprocessor device, and various analog-to-digital converters, digital-to-analog converters, and other support circuits and/or combinations of the foregoing. Control and signal processing functions of the system are allocated between these processing devices according to their respective capabilities. The processing device may include functionality to operate one or more software programs based on computer-readable instructions thereof, which may be stored in a memory device.

The processing device 112 is operatively coupled to the communication device 111 and the memory device 113. The processing device 112 uses the communication device 111 to communicate with the network 102, and other devices on the network 102, including but not limited to the bank computer systems 120 and the bank servers 130. As such, the communication device 111 generally comprises a modem, server, or other device for communicating with other devices on the network 102, and a display, mouse, keyboard, microphone, and/or speakers for communicating with one or more users, including an employee 104. As further illustrated in FIG. 1, the employee computer systems 110 include computer-readable instructions 114 stored in the memory device 113, which include the computer-readable instructions 114 of a capacity model application 115. As discussed later, the capacity model application 115 allows the employee 104 to receive data related to the capacity of an application or system, use that information to determine the current transaction capacity of the application or system, and forecast the need for capacity upgrades based on volume projections. In some embodiments the memory device 113 includes a datastore 117 for storing data related to the employee computer systems 110, including but not limited to data created or used by the capacity model application 115.

The bank computer systems 120 generally include a communication device 121, a processing device 122, and a memory device 123. The processing device 122 is operatively coupled to the communication device 121 and the memory device 123. The processing device 122 uses the communication device 121 to communicate with the network 102, and other devices on the network 102, including but not limited to the employee computer systems 110, and the bank servers 130. As such, the communication device 121 generally comprises a modem, server, or other device(s) for communicating with other devices on the network 102, and a display, mouse, keyboard, microphone, and/or speakers for communicating with one or more users. As further illustrated in FIG. 1, the bank computer systems 120 contain computer-readable program instructions 124 stored in the memory device 123, which includes the computer-readable instructions 124 of bank applications 125. The bank applications 125, in one embodiment, include the applications for which the capacity modeling is performed. In some embodiments the memory device 123 includes a datastore 127 for storing data related to the bank computer systems 120, including but not limited to data created or used by the bank applications 125. Although FIG. 1 illustrates the bank computer systems 120 as one system, it is important to note that there can be one or multiple systems, or the bank computer systems 120, can be incorporated with other systems, such as the bank servers 130.

The bank servers 130 generally include a communication device 131, a processing device 132, and a memory device 133. The processing device 132 is operatively coupled to the communication device 131, and the memory device 133. The processing device 132 uses the communication device 131 to communicate with the network 102, and other devices on the network 102, including but not limited to the employee computer systems 110, and the bank computer systems 120. As such, the communication device 131 generally comprises a modem, server, or other device(s) for communicating with other devices on the network 102. As further illustrated in FIG. 1, the bank servers 130 contain computer-readable program instructions 134 stored in the memory device 133, which includes the computer-readable instructions 134 of bank applications 135. The bank applications 135, in one embodiment, include the applications for which the capacity modeling is performed. In some embodiments the memory device 133 includes a datastore 137 for storing data related to the bank servers 130, including but not limited to data created or used by the bank applications 135. Although FIG. 1 illustrates the bank servers 130 as one system, it is important to note that there can be one or multiple systems with one or multiple bank applications 135, or the bank servers 130 can be incorporated with other systems, such as the bank computer systems 120.

The capacity modeling system 100 incorporates numerous aspects, such as transaction characteristics and volumes, operational process constraints, application architecture, and infrastructure-specific parameters into a single unified capacity model. It is generic enough to be applied to various applications but at the same time provides tuning parameters to enter specific information related to specific applications and systems. The capacity modeling system 100 uses past run-time data to develop statistical models for an application and then applies an optimization algorithm to incorporate the concepts of windows, shifts, and constraints from operational processing times and transaction characteristics. The capacity modeling system 100 includes a formal mechanism to determine the current transaction capacity of an application and forecast the need for capacity upgrades based on volume forecast projections and actual transaction history. It provides an accurate determination of the transactional capacity of an application, incorporates volume forecasts, and provides decision makers the information to make the best investment decisions in regard to changing capacity requirements.

The capacity modeling system 100, determines the transaction capacity of applications at various levels, such as a single window, a shift, a complete day, a month, a year, etc. A window comprises at least one job related to the transactions that occur for that application, and within the job are a number of steps that need to be completed to finish the job. Multiple windows make up a shift, and multiple shifts occur within a day. Between the windows and shifts are inter-windows, which contain more jobs that need to be completed before a new window or shift can begin. Each application has various numbers of jobs, windows, and shifts for each day, which are determined, in part, by the capacity and time constraints for the windows and inter-windows for the application. Furthermore, the jobs, windows, and shifts, in some embodiments, are spread across various locations or application platforms, thus, multiple capacity models can be created for the various locations or application platforms. These multiple capacity models can be created separately from each other or they can be created under a single capacity model.

The capacity for each window, shift, day, month, year, etc. provides the operations teams at the bank, with both short and long-term estimates of the application's capacity and its ability to deal with increased transaction volumes. The capacity modeling system 100 helps to prevent wasteful allocation of capital for infrastructure upgrades by providing a roadmap of capacity utilization and forecast timelines for upgrades to applications and systems.

In situations of high variability in transaction volumes (e.g. peak volumes during certain runs of the month) the capacity model system 100 provides insight for operations teams to develop effective and inexpensive process and technology measures to increase application throughput, such as a redistribution of the jobs for peak volume times. In this way, the operations teams can avoid capital-intensive and resource-consuming capacity upgrades. The capacity modeling system 100 helps achieve significant cost savings, as well as technology and operational process improvements. The capacity model can be easily tuned to accommodate various applications, such as, infrastructure capacity upgrades such as next generation processors, operational process changes such as additional window runs, SLA changes and technology improvements such as application enhancements.

FIG. 2 illustrates a process flow outlining, in accordance with one embodiment, the process involved in determining the transactional capacity of an application. The process in FIG. 2 is described generally as it would relate to many applications, and will be further explained in more detail as it relates to a capacity model of an automated clearing house ("ACH") application. The ACH application is used to process check images and check data collected from various financial institutions and distribute the check images and check data to other financial institutions.

FIG. 3 illustrates the formulation of the capacity model as a constrained optimization problem for an application. FIG. 3 outlines, in part, in diagram form the capacity model including various windows, and a specific SLA period 302. In one embodiment, the SLA period 302 could be one shift that includes, window1 310, window2 320, and window3 330. After each window there are inter-windows, such as inter-window1 340, inter-window2 350, and inter-window3 360, which represents processes run between the various windows and shifts. The model in FIG. 3, can be used for various applications or it can be modified for use with other applications. However, the model as shown illustrates the capacity model, in part, for the ACH application.

For the ACH application capacity model, detailed run-time performance data is used to develop a statistical model for various window and shift run-times, as illustrated in FIG. 3. The window1 310 run-time model is based on transaction characteristics, including collections (C1), distributions (D1), window1 310 run-time (T1), the number of job steps in the window, and infrastructure parameters, such as processor type. A separate run-time model for each individual window and shift can be set up in much the same way as the window1 310 run-time model and SLA period 302.

As illustrated by block 202 in FIG. 2, the first step in the process is to gather transactional data details related to transaction characteristics for each application. This includes identifying what the transactional characteristics are, such as volume and run-time of the transactions, and then collecting the associated data through historical transaction monitoring. The transaction characteristics are transferred, either manually or automatically to the capacity model application 115. In some embodiments this includes the employee 104 capturing data from the bank computer systems 120 and/or bank servers 130 for a particular application and manually transferring the data to the capacity model, in the capacity model application 115. However, in other embodiments of the invention the data may be transferred automatically to the capacity model application 115 through the communication device 121 operatively communicating with the banks computer system 120 or bank servers 130. For, example in the ACH application the employee 104 gathers the transaction characteristics related to the collections and distributions for transactions clearing for each ACH platform.

When a transaction is cleared through ACH there is collection data (i.e. data related to preparation of the transaction so it may be cleared) and distribution data (i.e. data related to sending the transaction through the proper channels) for each transaction. Throughout the day on the ACH platforms, jobs related to the collections and distributions of the transactions are run during various windows. Each window must be completed within a certain amount of time in order to process the collections and distributions before specific deadlines occur. As illustrated in FIG. 3, in order for the job in window2 320 to start, inter-window1 340 jobs must take place first for processing the collections and distributions from window1 310 in downstream applications. The number of transactions that the application can handle during each window and the amount of time necessary within each window and between windows to process the transactions are used in determining the capacity of the application. The collection and distribution transaction characteristics, in regard to the ACH application, include but are not limited to the volume of collections and distributions and the elapsed time for the respective collection and distribution steps of a job within a window. The elapsed time for the collections and distribution steps in the jobs are then aggregated to determine the total time for the window or inter-window process runs.

As illustrated by block 204, the next step in the process is to develop a window run-time estimator model. The run-time estimator is a model comprising the specific steps for each respective location's (e.g. platform) job in a window. Historical details of each job are gathered over time. The historical details comprise, in one embodiment, an average of the data related to the individual steps in each job, thereby accounting for the differences in time of day, week, month or quarter. For example, in one embodiment the steps are broken down to the average time for each step and the percentage of elapsed time for the overall job. In other embodiments, the peak historical data may be used or other measures of data may be used to create the window run-time estimator.

In order to include the historical transactional characteristics in the window run-time estimator historical data for the transactional characteristics is used in a statistical analysis, such as in one embodiment, a linear regression analysis. For a linear regression analysis the transactional characteristics are plotted on a chart, for each related job step. In some embodiments, the regression analysis is based on the number of transactional characteristics and the amount of time it took each platform to complete each related job step. A best-fit linear line is applied to the chart, in some embodiments, to illustrate the capacity volume verses run-time for the transactional characteristics. The equation associated with the best-fit line can be used in the window run-time estimator to determine the estimated run-time for the window based on the number of transactional characteristics for the window. The aggregation of these statistical models for each job step results in the run-time estimator model for a window. In other embodiments of the invention, other statistical analysis models are used to determine a best fit line for various transactional characteristics for the window run-time estimator. The equations for the best-fit line can result in a number of various constants and multipliers for the variables.

To create the run-time estimator for the ACH application the number of collections and distributions for sample runs of the ACH jobs are collected over time. In addition, the various steps that comprise the window run are analyzed to determine the run-time of each job step as a function of the number of collections and distributions and the infrastructure platform on which it runs. Where the job steps are not dependent on the number of collections and distributions, the job step run-time can be estimated by taking the average of the job step run-times. Alternatively, the collections and distributions for each dependent job step are used in a linear regression analysis. The number of collections and distributions for a particular job or window are plotted against the time it took the application to complete the job or window for that number of collections and distributions. A best-fit linear line is applied to the collection and distribution plots to determine the regression analysis linear equation and therefore the associated constants and multipliers for the collections and distributions related to a particular step, job, or window.

The constants and multipliers allow for the determination of the run-time for a window, based on the number of collections and distributions and infrastructure platform parameters. As discussed in further detail later, the run-time estimators are then combined with operational constraints and framed as a constrained optimization problem to determine the maximum transaction capacity.

The capacity model system 100 provides a simple and easy-to-use interface to provide site-specific parameters and operational constraints. A part of the capacity model application 115 for the ACH application, in one embodiment, is illustrated in FIG. 4, which outlines the inputs for the constants and multipliers for a run-time window estimator model, including but not limited to, the location constant 402, the location collection multiplier 404, and the location distribution multiplier 406 listed in the window run-time estimator table 400. The multipliers are the coefficients of the variables of the statistical regression model created for a run-time window estimator. The location constant 402 is a constant used to predict, in part, the estimated run-time of the job in the window. The collection multiplier 404 is used to predict, in part, the estimated run-time of the job in the window based on the number of collections for the window. The distribution multiplier 406 is used to predict, in part, the estimated run-time of the job in the window based on the number of distributions for the window.

As illustrated by block 206, the next step in the process is for the employee 104 to define the constraints and other variables for the capacity model. The constraints could include, but are not limited to, defining work shifts, file delivery, and processing requirements. The constraints will vary from application to application and thus are based on the capabilities of the applications and systems on which the applications run.

As illustrated in FIGS. 5a and 5b, for the ACH application, the other variables table 500 and the constraints table 550 include, but are not limited to, other variables 502 and constraints 552 such as the maximum run-time of the shift, windows, and inter-windows, as well as the ratio of the collections to distributions for each of the windows. In the ACH application, model constraints 552 and other variables 502 are determined based on staffing practices and operational requirements for the application, work shifts, SLAs and time requirements for ancillary activities. The ancillary activities include, but are not limited to, balancing, exceptions, and report jobs for the collections and distributions after the window is completed. The ratio of collections to distributions, in one embodiment, can be based at least in part on the historical data captured for the ratio over time.

In regard to the ACH application, some of the constraints 552 and other variables 502 for the capacity modeling system 100 are outlined in FIG. 3, for example, in one embodiment the employee 104 determines that shift time for the model is less than a total time (i.e. 5 hours), each window run-time is less than a specified time (i.e. 31, 37, and 35 mins respectively), and the values of the ratios of collections to distributions for each window (i.e. 2, 0.5, and 1 respectively). As illustrated, in FIG. 5a these and other variables are inputted into the capacity model application 115 and are shown in seconds or ratios in the value column 504 of the other variables table 500. Some of the other variables 502 are transferred automatically or manually to the constraints table 550 in FIG. 5b. FIG. 5b illustrates the constraints table 550, which uses some of the same value data as the other variables 502 in the other variables table 500 in FIG. 5a, such as the total run-time of the shifts, the maximum run-time of each window, and the ratio of collections to distributions for each window. As with the other variables table 500, the constraints table 550 lists the numerical value of the constraints 552 in the constraints value column 554 in seconds or ratios.

The constraints table 550, also has a formula column 556 and a relation column 558. The formula column 556, as discussed later, contains equations that are used to optimize the value in the formula column in relation to the other formulas and constraints. The relation column 558 illustrates that the output of the formula column 556 must be less than, equal to, or less than or equal to the constraint listed in the value column 554. In other embodiments, the relation can also be greater than, or greater than or equal to the constraints listed in the value column 554.

As illustrated by block 208, the windows run-time estimator information from block 204 and the constraints and other variables from block 206 are used to develop a shift run-time estimator. Again, as illustrated by FIG. 3, a shift consists of multiple window runs and interspersed intra-window runs, including operational activities like balancing and reporting. Each of the window run-time estimators are used to help determine the transactional capacity of a shift, in which they are located. The shift run-time estimator is formulated from the window run-time estimator and the constraints and other variables. The shift run-time estimator uses constants and multipliers from the window run-time estimators, and constraints and other variables for the windows (e.g. maximum run-time, etc.) and inter-window times (e.g. interim run-times) to calculate the capacity by window, shift and processing day.

For the ACH application, the shift run-time estimator is formulated from the window run-time estimator information illustrated in FIG. 4 and the constraints 552 and other variables 502 illustrated in FIGS. 5a and 5b. As previously discussed, the constraints table 550 further comprises formula 556 and relation 558 columns. The formula column 556 includes optimization formulas that take into account the constant 402, the collection multiplier 404, the distribution multiplier 406, etc. For example, as illustrated in FIG. 5b the maximum run-time of window1 is less than or equal to 1740 seconds as illustrated by the relation column 558 and the value column 554. The formula for this value is as follows: constant 402+(collection multiplier 404*# of collections in window1 output)+(distribution multiplier 406*# of distributions in window1 output). The collections in window1 output and the distributions in window1 output, which are optimized by the optimization solver, are illustrated in the capacity window output table 650 of FIG. 6. Similar formulas are set up for the rest of the window run-times and other formula are set up for total run-times of the shifts. For example, the total run-time of shift 1 (16368 seconds) equals the sum of the estimated run-times of window 1 through window 4 (1740+ 3984+1980+2364 seconds), illustrated in the constraints table 550, which is then added to the sum of the estimated run-times of inter-window1 through inter window4 (1200+ 1200+1200+2700), illustrated in the other variables table 500.

As illustrated by block 210 in FIG. 2, the shift run-time estimator is used to determine the transactional daily, monthly, yearly, etc. capacity of the application. The formulas for the capacity model, including the operational constraints and shift run-time estimator model, can be framed and solved as a constrained optimization problem. The number of maximum transactions for each window which also satisfies the constraints results in the transactional capacity of the window for the application. The maximum transactional capacities of the windows are combined to find the maximum transactional capacity of the shifts. The maximum transactional capacities of the shifts are combined to find the maximum transactional capacity for the application for the day, etc.

As illustrated in FIG. 6, in one embodiment for the ACH application, a solver function will optimize the number of collections and distributions for each window and shift based on the window run-time estimator table 400, constraints 552 and other variables 502, and the formula column 556 listed in FIG. 5b. As previously discussed, the formulas in the formula column 556 use the location constant 402, the collection multiplier 404, and the distribution multiplier 406 calculated from the linear regression best-fit line to calculate the maximum transactions and ratios of the windows and shifts. The optimization solver outputs the capacity of the application for the collections and distributions for the shifts in the capacity shift solver table 600 and for the windows in the capacity window output table 650, as illustrated in FIG. 6.

For example, as illustrated by the transactional capacity solver table 600 in FIG. 6, the maximum total capacity for the ACH application is optimized by the optimization solver. The maximum total transactional capacity for the day (31,535, 306) equals the sum of the transactional capacities of the shifts (18,291,277+7,118,474+6,125,554). In other embodiments, other maximum total capacities for a particular shift, window, or job, on a particular day can be optimized by the solver. For example, the transactional capacity of each shift, such as Shift1 610, Shift2 612, and Shift3 614, can be optimized. In other embodiments the transactional capacity of a particular window or job can be optimized.

FIG. 6 also illustrates the transactional capacity window output table 650. As illustrated in the description column 652 and the output column 654 the number of distributions and collections in each window is determined when the optimization solver is run. For example, the number of distributions in window1 (6,704,045) is calculated. This is calculated because in order to reach the maximum total number of transactional capacity per day (31,535,306) the maximum run-time of window1 from the formula column 556 in FIG. 5b is optimized (1740 seconds). The ratio of collections to distributions for window1 is zero (0) as illustrated in FIG. 5b.

Therefore, in order to reach the maximum run-time of window1 (1740 seconds) the number of collections (0) and the number of distributions (6,704,045) is calculated using the window run-time estimator constants and multipliers (1740=533+(0*0.001053)+(6,704,045* 0.000180). The rest of the collections and distributions in the transactional capacity window output table 650 are calculated in the same way.

Thereafter, as illustrated by block 212, volume forecasts for the application, which include volume increases to the application due to organic growth and new acquisitions or significant initiatives, in some embodiments are gathered by the operations teams. These volume forecasts, in some embodiments, are based on historical data that is gathered for each window and shift over the span of days, weeks, and/or years. The volume forecasts are received by the capacity model application 115, and are evaluated against the transaction capacity of the application, determined in block 210. In some embodiments of the invention, the volume forecasts can be calculated by the capacity model application 115 automatically from historical data.

As illustrated by decision diamond 214, the volume forecasts or actual transaction peaks from are compared to the application capacity from the capacity model, as illustrated in one embodiment in FIG. 7. FIG. 7 illustrates, for the ACH application, a capacity vs. peaks table 700 outlining the maximum capacity of various sites for collections, distributions, and total capacity of the shifts in a day compared to the peak transactions for collections, distributions, and total transactions for the same shifts during a particular month. In other embodiments the maximum capacity can be analyzed against other transaction data for other days, months, years, etc. or for particular windows, jobs, steps, etc.

If the differences between the maximum transactional capacity and the actual peaks or forecasted capacity are acceptable the analysis is complete, as illustrated by termination block 216. If however, issues are discovered between the optimized capacity and the forecasted transaction volume or actual past transactions, then corrective actions are developed, as illustrated by block 218.

For example, in the capacity section 710, the collection column 712 and distribution column 714 indicate that for the morning shift the capacity for the collections is 1,961,365 transactions, and the capacity for the distributions is 9,205,881 transactions. Alternatively, in the actual peaks section 720, the collection column 722 and distribution column 724 indicate that for the morning shift in November the peak collection was 2,370,689 transactions and the peak distribution was 2,854,472 transactions. Therefore, there seems to be plenty of capacity for the distributions. However, since at one point the peak collection (2,854,472) is greater than the capacity collection (1,961,365) for that particular shift and site, then the operations teams would develop corrective actions to make sure the capacity is great enough to handle the peak collections at that time.

The corrective actions may be in the form of capacity upgrades, application changes, or operational process improvements identified to alleviate capacity constraints. Thereafter, the above process is repeated on a periodic basis or when there is a change in the business or technology environment or volume forecasts, as illustrated by block 220.

Specific embodiments of the invention are described herein. Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments and combinations of embodiments are intended to be included within the scope of the appended claims. Although specific terms are employed herein, they are used in a generic and descriptive sense only and not for purposes of limitation.

What is claimed is:

1. A capacity modeling system, for creating a capacity model, comprising:
   a memory device;
   a communication device; and
   a processing device, operatively coupled to the memory device and the communication device, and configured to execute computer-readable program code to:
   capture transactional data for an application;
   run a window run-time estimator model based on the transactional data, wherein the window run-time estimator model is a model comprising specific steps for each job in a window;
   apply constraints to the capacity model, wherein the constraints are based on capabilities of the application and systems on which the application is run;
   run a shift run-time estimator model based on the window run-time estimator model and the constraints, wherein the shift run-time estimator model determines an estimated transactional capacity of a shift, wherein a shift comprises multiple window runs and interspersed intra-window runs;
   calculate a transaction capacity of the application; and
   compare volume forecasts with the transaction capacity of the application to determine when the transaction capacity needs to be addressed.

2. The capacity modeling system of claim 1, wherein the processing device is further configured to execute computer-readable program code to run volume forecasts for the application.

3. The capacity modeling system of claim 1, wherein the processing device is further configured to execute computer-readable program code to receive volume forecasts for the application.

4. The capacity modeling system of claim 1, wherein the window run-time estimator model is based on a statistical analysis of historical transactional data.

5. The capacity modeling system of claim 4, wherein the window run-time estimator model is based on a regression analysis of historical transactional data.

6. The capacity modeling system of claim 1, wherein the constraints applied to the capacity model are constraints on the window, inter-window, or shift run-times.

7. The capacity modeling system of claim 1, wherein the transaction capacity of an application is calculated through the use of an optimization solver.

8. A computer program product for a capacity modeling system, for creating a capacity model, the computer program product comprising at least one non-transitory computer-readable medium having computer-readable program code portions embodied therein, the computer-readable program code portions comprising:
   an executable portion configured for capturing transactional data for an application using a processing device operatively coupled to a communication device and a memory device;
   an executable portion configured for running a window run-time estimator model based on the transactional data, using the processing device, wherein the window run-time estimator model is a model comprising specific steps for each job in a window;

an executable portion configured for applying constraints to the capacity model, using the processing device, wherein the constraints are based on capabilities of the application and systems on which the application is run;

an executable portion configured for running a shift run-time estimator model based on the window run-time estimator model and the constraints, using the processing device, wherein the shift run-time estimator model determines an estimated transactional capacity of a shift, wherein a shift comprises multiple window runs and interspersed intra-window runs;

an executable portion configured for calculating a transaction capacity of the application; and and executable portion configured for comparing volume forecasts with the transaction capacity of the application to determine when the transaction capacity needs to be addressed.

9. The computer program product of claim 8, further comprising:
an executable portion configured for developing volume forecasts for the application.

10. The computer program product of claim 8, further comprising:
an executable portion configured for receiving volume forecasts for the application, using the processing device.

11. The computer program product of claim 8, wherein the executable portion configured for running the window run-time estimator model is configured to develop the window run-time estimator based on a statistical analysis of historical transactional data.

12. The computer program product of claim 11, wherein the executable portion configured for running the window run-time estimator model is configured to develop the window run-time estimator based on a regression analysis of historical transactional data.

13. The computer program product of claim 8, wherein the executable portion configured for applying the constraints to the capacity model, is configured for applying the constraints to the window, inter-window, or shift run-times.

14. The computer program product of claim 8, wherein the executable portion configured for calculating transaction capacities of an application, is configured to calculate the transaction capacities of an application through the use of an optimization solver.

15. A capacity modeling method for developing a capacity model, comprising:
capturing transactional data for an application using a processing device, operatively coupled to a memory device and a communication device, and configured to execute computer-readable program code;

running a window run-time estimator model based on the transactional data, using the processing device, wherein the window run-time estimator model is a model comprising specific steps for each job in a window;

applying constraints to the capacity model, using the processing device, wherein the constraints are based on capabilities of the application and systems on which the application is run;

running a shift run-time estimator model based on the window run-time estimator model and the constraints, using the processing device, wherein the shift run-time estimator model determines an estimated transactional capacity of a shift, wherein a shift comprises multiple window runs and interspersed intra-window runs;

calculating a transaction capacity of the application; and comparing volume forecasts with the transaction capacity of the application to determine when the transaction capacity needs to be addressed.

16. The capacity modeling method of claim 15, further comprising:
developing volume forecasts for the application, using the processing device.

17. The capacity modeling method of claim 15, further comprising:
receiving volume forecasts for the application, using the processing device.

18. The capacity modeling method of claim 15, further comprising:
developing corrective actions for the capacity of the application when the transaction capacity needs to be addressed.

19. The capacity modeling method of claim 15, further comprising:
calculating the transaction capacity of the application on a periodic basis or after events occur which affect the transaction capacity of the application.

20. The capacity modeling method of claim 15, wherein running a window run-time estimator model based on the transactional data comprises using a statistical analysis of historical transactional data.

21. The capacity modeling method of claim 20, wherein running a window run-time estimator model based on the transactional data comprises using a regression analysis of historical transactional data.

22. The capacity modeling method of claim 15, wherein applying constraints to the capacity model comprises applying constraints to the window, inter-window, or shift run-times.

23. The capacity modeling method of claim 15, wherein calculating transaction capacities of an application comprises using an optimization solver.

* * * * *